(12) United States Patent
Lim et al.

(10) Patent No.: US 12,112,701 B2
(45) Date of Patent: Oct. 8, 2024

(54) DISPLAY DEVICE

(71) Applicant: Samsung Display Co., Ltd., Yongin-si (KR)

(72) Inventors: Danwon Lim, Yongin-si (KR); Hyunjoon Kim, Yongin-si (KR); Bon-Yong Koo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/321,900

(22) Filed: May 23, 2023

(65) Prior Publication Data
US 2024/0096281 A1 Mar. 21, 2024

(30) Foreign Application Priority Data

Sep. 16, 2022 (KR) .................... 10-2022-0117111

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01)

(58) Field of Classification Search
CPC ......... G09G 3/3233; G09G 2300/0426; G09G 2300/0819; G09G 2300/0842; G09G 2300/0861; G09G 2310/08; H10K 59/131
See application file for complete search history.

(56) References Cited

U.S. PATENT DOCUMENTS

| 9,691,325 B2 | 6/2017 | Park et al. | |
|---|---|---|---|
| 2006/0028408 A1 | 2/2006 | Kim | |
| 2017/0018222 A1* | 1/2017 | Park | H10K 59/12 |
| 2017/0047011 A1* | 2/2017 | Yoon | G09G 3/3233 |
| 2018/0182296 A1* | 6/2018 | Wang | G09G 3/3233 |

(Continued)

FOREIGN PATENT DOCUMENTS

| KR | 10-0570763 | 4/2006 |
|---|---|---|
| KR | 10-0698681 | 3/2007 |

(Continued)

*Primary Examiner* — Ryan A Lubit
(74) *Attorney, Agent, or Firm* — KILE PARK REED & HOUTTEMAN PLLC

(57) ABSTRACT

A display device includes a display panel including a first pixel, a second pixel, and a connection line connecting the first pixel and the second pixel. Each of the first pixel and the second pixel includes a light emitting element, a first transistor including a first electrode, a second electrode electrically connected to the light emitting element, and a gate electrode, a second transistor connected between a first driving voltage line and a connection node and including a gate electrode connected to an emission line, a third transistor connected between a second driving voltage line and the connection node and including a gate electrode connected to the emission line, and a capacitor connected between the gate electrode of the first transistor and the connection node. The connection node of the first pixel is electrically connected to the connection node of the second pixel through the connection line.

20 Claims, 7 Drawing Sheets

(56) References Cited

U.S. PATENT DOCUMENTS

| | | | |
|---|---|---|---|
| 2019/0088731 A1* | 3/2019 | Lee .................. | H01L 29/78696 |
| 2021/0134232 A1* | 5/2021 | Ueno .................. | G09G 3/3266 |
| 2021/0193055 A1* | 6/2021 | Lee ...................... | G09G 3/3233 |
| 2021/0193691 A1* | 6/2021 | Lee ...................... | G09G 3/3233 |

FOREIGN PATENT DOCUMENTS

| | | |
|---|---|---|
| KR | 10-1986657 | 6/2019 |
| KR | 10-2274740 | 7/2021 |

* cited by examiner

DISPLAY DEVICE

CROSS-REFERENCE TO RELATED APPLICATIONS

This application claims priority under 35 U.S.C. § 119 from Korean Patent Application No. 10-2022-0117111 filed on Sep. 16, 2022 in the Korean Intellectual Property Office, the entire contents of which are incorporated herein by reference.

BACKGROUND

1. Technical Field

Embodiments of the disclosure described herein relate to a display device.

2. Description of the Related Art

Electronic devices such as a smart phone, a digital camera, a notebook computer, a navigation system, a monitor, and a smart television provide images to users and include a display device for displaying the images. The display device generates an image and provides the users with the generated image through a display screen.

The display device includes pixels and driving circuits (e.g., a scan driving circuit, a data driving circuit, and an emission driving circuit) for controlling the pixels. Each of the pixels include a display element and a pixel circuit for controlling the display element. The driving circuit of a pixel may include multiple transistors operatively connected to one another.

SUMMARY

Embodiments of the disclosure provide a display device having an improved image quality.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a display panel that may include a first pixel, a second pixel, and a connection line electrically connecting the first pixel and the second pixel. Each of the first pixel and the second pixel may include a light emitting element, a first transistor including a first electrode, a second electrode electrically connected to the light emitting element, and a gate electrode, a second transistor electrically connected between a first driving voltage line and a connection node and including a gate electrode electrically connected to an emission line, a third transistor electrically connected between a second driving voltage line and the connection node and including a gate electrode electrically connected to the emission line, and a capacitor electrically connected between the gate electrode of the first transistor and the connection node. The connection node of the first pixel may be electrically connected to the connection node of the second pixel through the connection line.

In an embodiment, a compensation voltage from the second driving voltage line may be provided to the connection node of each of the first pixel and the second pixel by the third transistor upon an emission signal provided to the emission line being at a first level. In an embodiment, a first driving voltage from the first driving voltage line may be provided to the connection node of each of the first pixel and the second pixel by the second transistor upon the emission signal provided to the emission line being at a second and different level.

In an embodiment, each of the first transistor and the second transistor may be a P-type transistor, and the third transistor may be an N-type transistor.

In an embodiment, each of the first pixel and the second pixel may further include a fourth transistor electrically connected between the gate electrode of the first transistor and a third driving voltage line, a fifth transistor electrically connected between the second transistor and the first electrode of the first transistor and including a gate electrode electrically connected to the emission line, a sixth transistor electrically connected between the second electrode of the first transistor and an anode of the light emitting element and including a gate electrode electrically connected to the emission line, a seventh transistor electrically connected between the anode of the light emitting element and a fourth driving voltage line and including a gate electrode electrically connected to the emission line, an eighth transistor electrically connected between the second electrode of the first transistor and the gate electrode of the first transistor, a ninth transistor electrically connected between a data line and the first electrode of the first transistor, and a tenth transistor electrically connected between the first electrode of the first transistor and a fifth driving voltage line.

In an embodiment, each of the fifth transistor, the sixth transistor, the ninth transistor, and the tenth transistor may be a P-type transistor. Each of the fourth transistor, the seventh transistor, and the eighth transistor may be an N-type transistor.

In an embodiment, during a non-emission period, the light emitting element does not emit light, and a compensation voltage from the second driving voltage line may be provided to the connection node of each of the first pixel and the second pixel by the third transistor. During an emission period, the light emitting element emits light, and a first driving voltage from the first driving voltage line may be provided to the connection node of each of the first pixel and the second pixel by the second transistor.

In an embodiment, the display panel may further include a third pixel. The connection line may electrically connect the first pixel, the second pixel, and the third pixel.

In an embodiment, the second driving voltage line may further include a horizontal driving voltage line extending in a first direction and a vertical driving voltage line connected to the horizontal driving voltage line and extending in a second direction intersecting the first direction. The vertical driving voltage line may be disposed adjacent to the third pixel.

According to an embodiment, a display device may include a display panel that may include a first pixel, a second pixel, and a connection line electrically connecting the first pixel and the second pixel. Each of the first pixel and the second pixel may include a light emitting element, a first transistor including a first electrode, a second electrode, and a gate electrode, a second transistor including a first electrode electrically connected to the connection line, a second electrode electrically connected to a first driving voltage line, and a gate electrode electrically connected to an emission line, a third transistor including a first electrode electrically connected to the connection line, a second electrode electrically connected to a second driving voltage line, and a gate electrode electrically connected to the emission line, and a capacitor electrically connected between the gate electrode of the first transistor and the connection line. The connection line may be disposed to overlap in a plan view the gate electrode of the first transistor of the first pixel and the gate electrode of the first transistor of the second pixel.

In an embodiment, each of the first pixel and the second pixel may further include a connection node, wherein the connection node of each of the first pixel and the second pixel may be electrically connected to the first electrode of the second transistor through a first contact hole, the second electrode of the third transistor through a second contact hole, and the connection line through a third contact hole.

In an embodiment, the connection line may extend in a first direction and a branch part may extend from the connection line in a second direction intersecting the first direction. The branch part may be electrically connected to the connection node through the third contact hole.

In an embodiment, the display panel may further include a base layer, a first insulating layer disposed on the base layer, and a second insulating layer disposed on the first insulating layer. The first transistor, the second transistor, and the connection line may be disposed between the base layer and the first insulating layer. The third transistor may be disposed between the first insulating layer and the second insulating layer. The connection node may be disposed on the second insulating layer.

In an embodiment, the connection line may be connected to the first electrode of the second transistor through the first contact hole passing through both the first insulating layer and the second insulating layer. The connection line may be connected to the second electrode of the third transistor through the second contact hole passing through the second insulating layer. The connection line may be connected to the connection node through the third contact hole passing through both the first insulating layer and the second insulating layer.

In an embodiment, the connection line may be spaced apart from the second driving voltage line in a second direction.

In an embodiment, the connection line may be disposed to overlap in a plan view the first driving voltage line.

In an embodiment, a compensation voltage from the second driving voltage line may be provided to the connection node of each of the first pixel and the second pixel by the third transistor upon an emission signal provided to the emission line being at a first level, and a first driving voltage from the first driving voltage line may be provided to the connection node of each of the first pixel and the second pixel by the second transistor upon the emission signal provided to the emission line being at a second and different level.

In an embodiment, each of the first transistor and the second transistor may be a P-type transistor, and the third transistor may be an N-type transistor.

In an embodiment, each of the first pixel and the second pixel may further include a fourth transistor electrically connected between the gate electrode of the first transistor and a third driving voltage line, a fifth transistor electrically connected between the second transistor and the first electrode of the first transistor and including a gate electrode electrically connected to the emission line, a sixth transistor electrically connected between the second electrode of the first transistor and an anode of the light emitting element and including a gate electrode electrically connected to the emission line, a seventh transistor electrically connected between the anode of the light emitting element and a fourth driving voltage line and including a gate electrode electrically connected to the emission line, an eighth transistor electrically connected between the second electrode of the first transistor and the gate electrode of the first transistor, a ninth transistor electrically connected between a data line and the first electrode of the first transistor, and a tenth transistor electrically connected between the first electrode of the first transistor and a fifth driving voltage line.

In an embodiment, each of the fifth transistor, the sixth transistor, the ninth transistor, and the tenth transistor may be a P-type transistor. Each of the fourth transistor, the seventh transistor, and the eighth transistor may be an N-type transistor.

In an embodiment, the display panel may further include a third pixel. The connection line may electrically connect to each of the first pixel, the second pixel, and the third pixel. The second driving voltage line may further include a horizontal driving voltage line extending in a first direction and a vertical driving voltage line electrically connected to the horizontal driving voltage line and extending in a second direction intersecting the first direction. The vertical driving voltage line may be disposed adjacent to the third pixel.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
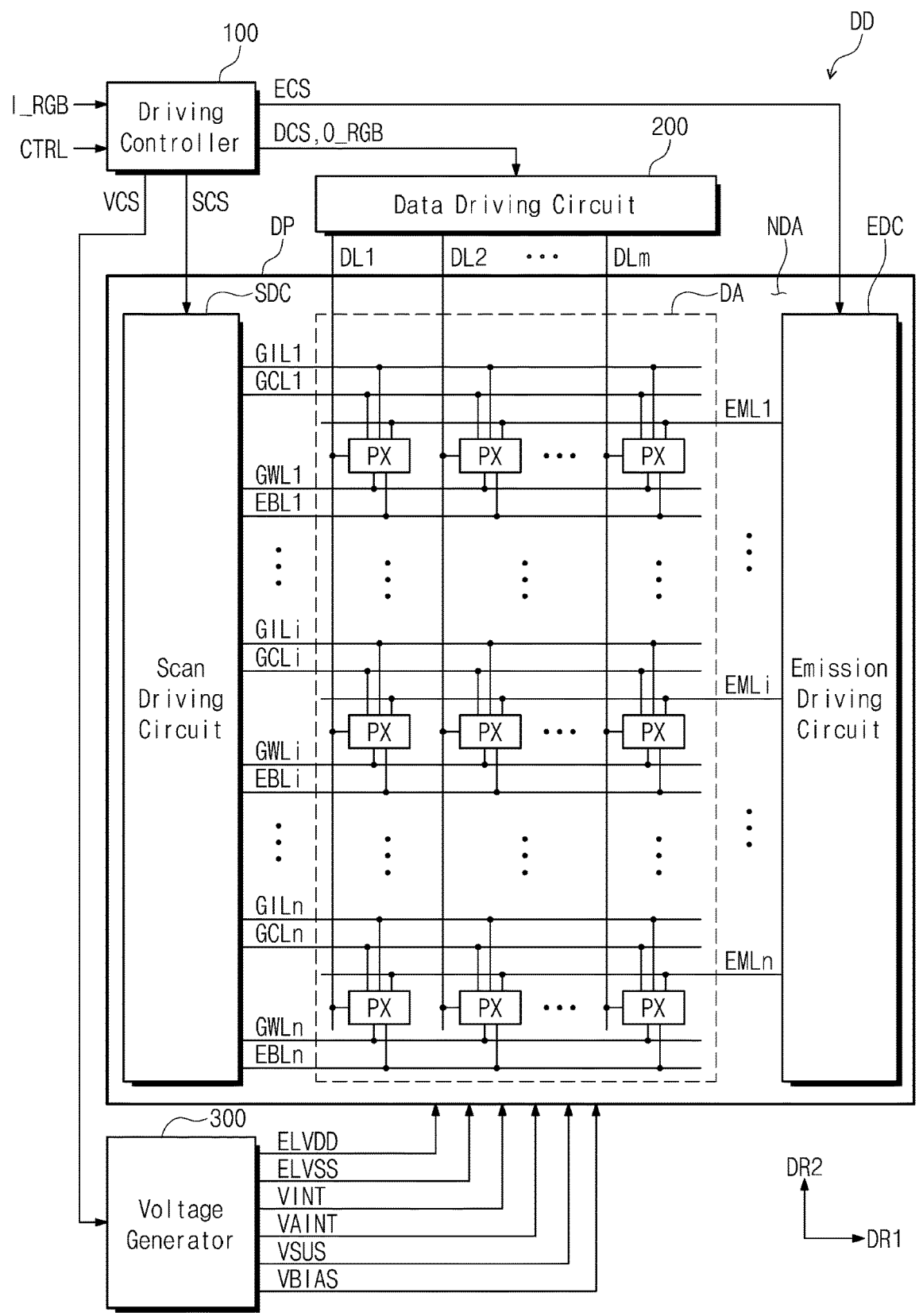
FIG. 1 is a schematic block diagram of a display device according to an embodiment of the disclosure.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to accompanying drawings. FIG. 1 is a schematic block diagram of a display device DD according to an embodiment of the disclosure. Referring to FIG. 1, the display device DD may include a display panel DP, a driving controller 100, a data driving circuit 200, a voltage generator 300, a scan driving circuit SDC, and an emission driving circuit EDC.

The driving controller 100 may receive an input image signal I_RGB and a control signal CTRL and may generate an output image signal O_RGB obtained by converting a data format of the input image signal I_RGB to fit the display panel DP. The driving controller 100 may also output a scan control signal SCS, a data control signal DCS, an emission control signal ECS, and a voltage control signal VCS.

The data driving circuit 200 may receive the data control signal DCS and the output image signal O_RGB from the driving controller 100, may convert the output image signal O_RGB into data signals, and outputs the data signals to multiple data lines DL1 to DLm to be described later. The data signals refer to analog voltages corresponding to a grayscale level of the output image signal O_RGB.

The voltage generator 300 may generate voltages necessary to operate the display panel DP. In an embodiment, the voltage generator 300 may generate a first driving voltage ELVDD, a second driving voltage ELVSS, a first initialization voltage VINT, a second initialization voltage VAINT, a compensation voltage VSUS, and a bias voltage VBIAS. Voltages generated by the voltage generator 300 may not be limited to the example shown in FIG. 1. The number of voltages generated by the voltage generator 300 and the voltage level of each voltage may be variously changed depending on the circuit configuration of a pixel provided in the display panel DP and as needed.

The display panel DP may include scan lines GIL1 to GILn, GCL1 to GCLn, and GWL1 to GWLn, and EBL1 to EBLn, emission lines EML1 to EMLn, the data lines DL1 to DLm, and pixels PX. The scan driving circuit SDC and the emission driving circuit EDC may be disposed on the display panel DP. In an embodiment, the pixels PX may be arranged in a display area DA. The scan driving circuit SDC and the emission driving circuit EDC may be arranged in a non-display area NDA.

In an embodiment, the scan driving circuit SDC may be arranged on a first side of the non-display area NDA of the display panel DP. The scan lines GIL1 to GILn, GCL1 to GCLn, GWL1 to GWLn, and EBL1 to EBLn may extend from the scan driving circuit SDC in a first direction DR1. The emission driving circuit EDC may be arranged on a second side of the non-display area NDA of the display panel DP. The emission lines EML1 to EMLn may extend from the emission driving circuit EDC in a direction opposite to the first direction DR1.

The scan lines GIL1 to GILn, GCL1 to GCLn, GWL1 to GWLn, and EBL1 to EBLn and the emission lines EML1 to EMLn may be spaced apart from one another in a second direction DR2 crossing or intersecting the first direction DR1. The data lines DL1 to DLm may extend from the data driving circuit 200 in a direction opposite to the second direction DR2, and may be spaced apart from one another in the first direction DR1.

In the example shown in FIG. 1, the scan driving circuit SDC and the emission driving circuit EDC may be arranged to face each other with the pixels PX disposed therebetween, but the present disclosure may not be limited thereto. For example, the scan driving circuit SDC and the emission driving circuit EDC may instead be positioned adjacent to each other on one of the first side and the second side of the display panel DP. In an embodiment, the scan driving circuit SDC and the emission driving circuit EDC may instead be implemented as one circuit.

Each of the pixels PX may be electrically connected to four corresponding scan lines among the scan lines GIL1 to GILn, GCL1 to GCLn, GWL1 to GWLn, EBL1 to EBLn and one corresponding emission line among the emission lines EML1 to EMLn. For example, as shown in FIG. 1, a first row of pixels PX may be electrically connected to the scan lines GIL1, GCL1, GWL1, and EBL1 and the emission line EML1. Furthermore, an i-th row of pixels may be electrically connected to the scan lines GILi, GCLi, GWLi, and EBLi and the emission line EMLi.

Each of the pixels PX may include a light emitting element ED (refer to FIG. 2) and a pixel circuit for controlling the emission of the light emitting element ED. The pixel circuit may include one or more transistors and one or more capacitors. The scan driving circuit SDC and the emission driving circuit EDC may also include transistors formed through a same process as transistors of the pixel PX. Each of the pixels PX may receive the first driving voltage ELVDD, the second driving voltage ELVSS, the first initialization voltage VINT, the second initialization voltage VAINT, the compensation voltage VSUS and the bias voltage VBIAS from the voltage generator 300.

The scan driving circuit SDC may receive the scan control signal SCS from the driving controller 100 and may output scan signals to the scan lines GIL1 to GILn, GCL1 to GCLn, GWL1 to GWLn, and EBL1 to EBLn in response to the scan control signal SCS. The emission driving circuit EDC may receive the emission control signal ECS from the driving controller 100 and may output emission signals to the emission lines EML1 to EMLn in response to the emission control signal ECS. According to an embodiment of the disclosure, the driving controller 100 may also output the scan control signal SCS for controlling timing of scan signals to be provided to the scan lines GIL1 to GILn, GCL1 to GCLn, GWL1 to GWLn, and EBL1 to EBLn based on the control signal CTRL. According to an embodiment of the disclosure, the driving controller 100 may also output the emission control signal ECS for controlling the timing of emission signals to be provided to the emission lines EML1 to EMLn based on the control signal CTRL.

Figure 2:
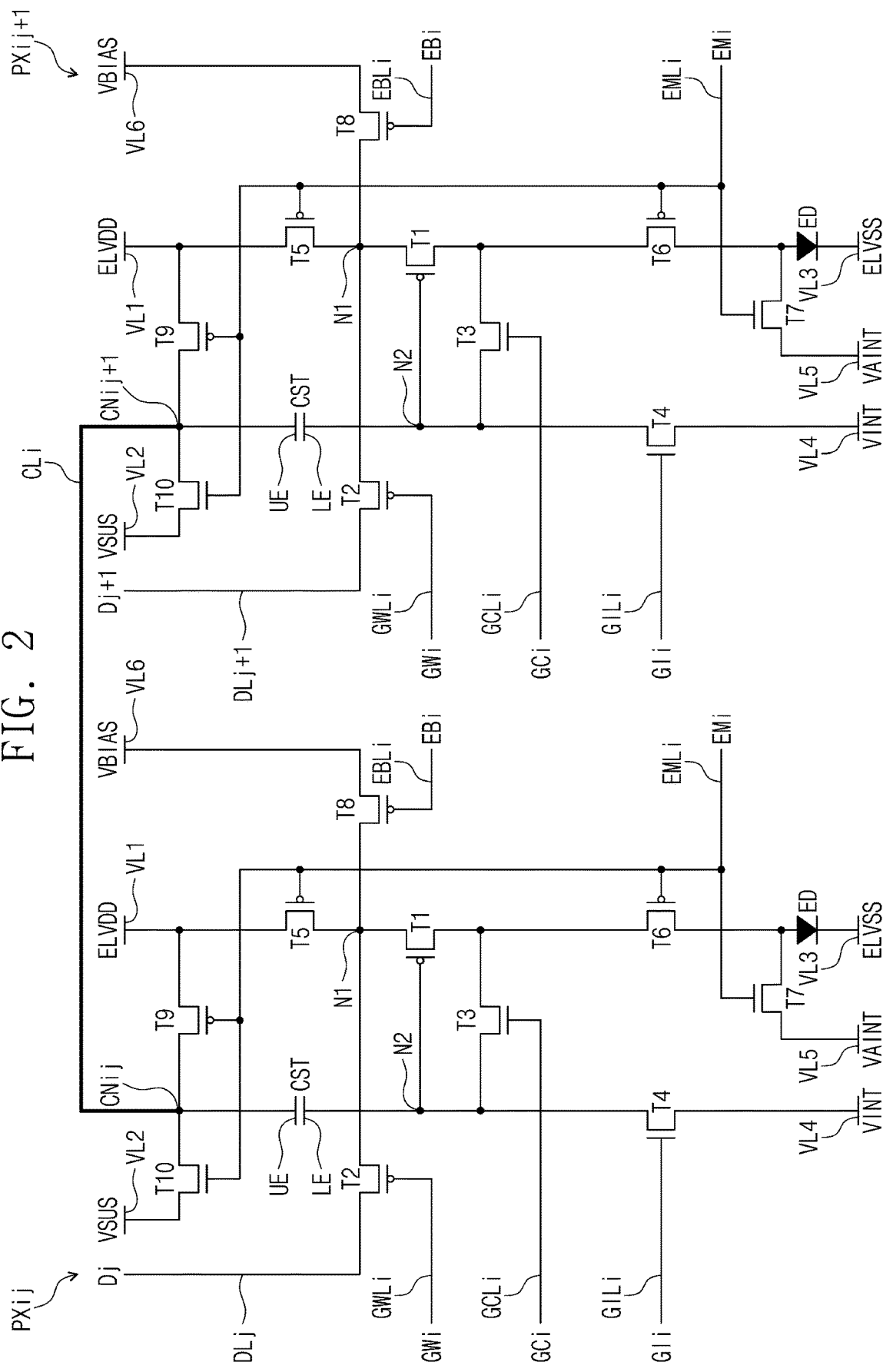
FIG. 2 is a schematic diagram of an equivalent circuit of a first pixel and a second pixel according to an embodiment of the disclosure.

FIG. 2 is a circuit schematic diagram of an equivalent circuit of a first pixel PXij and a second pixel PXij+1 according to an embodiment of the disclosure. Referring to FIG. 2, the first pixel PXij may include first to tenth transistors T1 to T10, a capacitor CST, and a light emitting element ED. In an embodiment, each of the pixels PX shown in FIG. 1 may include a same circuit configuration as the first pixel PXij shown in FIG. 2.

Among the first to tenth transistors T1 to T10, the third, fourth, seventh, and tenth transistors T3, T4, T7, and T10 may be N-type transistors by using an oxide semiconductor as a semiconductor layer, and each of the first, second, fifth, sixth, eighth, and ninth transistors T1, T2, T5, T6, T8, and T9 may be a P-type transistor having a low-temperature polycrystalline silicon (LTPS) semiconductor layer, however the disclosure may not be limited thereto. For example, all of the first to tenth transistors T1 to T10 may instead be P-type transistors or N-type transistors. In an embodiment, at least one of the first to tenth transistors T1 to T10 may be an N-type transistor, and the other(s) thereof may be P-type transistors.

The scan lines GILi, GCLi, GWLi, and EBLi may deliver scan signals Gli, GCi, GWi, and EBi, respectively. The emission line EMLi may deliver an emission signal EMi. The data line DLj may deliver a data signal Dj. The data signal Dj may have a voltage level corresponding to the output image signal O_RGB output from the driving controller 100. First to sixth driving voltage lines VL1, VL2, VL3, VL4, VL5, and VL6 may deliver the first driving voltage ELVDD, the compensation voltage VSUS, the second driving voltage ELVSS, the first initialization voltage VINT, the second initialization voltage VAINT, and the bias voltage VBIAS respectively.

The first transistor T1 may include a first electrode electrically connected to a first node N1, a second electrode, and a gate electrode electrically connected to a second node N2. The second transistor T2 may be electrically connected between the data line DLj and the first node N1, and includes a gate electrode electrically connected to the scan line GWLi. The second transistor T2 may be turned on in response to the scan signal GWi received through the scan line GWLi, and may deliver the data signal Dj received from the data line DLj to the first node N1.

The third transistor T3 may be electrically connected between the second electrode of the first transistor T1 and the second node N2, and may include a gate electrode electrically connected to the scan line GCLi. The third transistor T3 may be turned on in response to the scan signal GCi received through the scan line GCLi to electrically connect the second N2 (i.e., the gate electrode of the first transistor T1) and the second electrode of the first transistor T1.

The fourth transistor T4 may be electrically connected between the second node N2 and the fourth driving voltage line VL4 and includes a gate electrode electrically connected to the scan line GILi. The fourth transistor T4 may be turned on in response to the scan signal Gli received through the scan line GILi to deliver the first initialization voltage VINT to the second node N2. In case that the fourth transistor T4 may be turned on, the second node N2 (i.e., the gate electrode of the first transistor T1) may be initialized to the first initialization voltage VINT.

The fifth transistor T5 may be electrically connected between the first driving voltage line VL1 and the first electrode of the first transistor T1 and includes a gate electrode electrically connected to the emission line EMLi. The sixth transistor T6 may be electrically connected between the second electrode of the first transistor T1 and an anode of the light emitting element ED, and includes a gate electrode electrically connected to the emission line EMLi. The fifth transistor T5 and the sixth transistor T6 may be turned on in response to the emission signal EMi received through the emission line EMLi. In case that the fifth transistor T5 and the sixth transistor T6 are turned on, a current may be delivered from the first driving voltage line VL1 to the light emitting element ED through the fifth transistor T5, the first transistor T1, and the sixth transistor T6.

The seventh transistor T7 may be electrically connected between the anode of the light emitting element ED and the fifth driving voltage line VL5, and may include a gate electrode electrically connected with the emission line EMLi. In case that the seventh transistor T7 is turned on in response to the emission signal EMi received through the emission line EMLi, the anode of the light emitting element ED may be initialized to the second initialization voltage VAINT provided through the fifth driving voltage line VL5.

The eighth transistor T8 may be electrically connected between the sixth driving voltage line VL6 through which the bias voltage VBIAS may be supplied and the first electrode of the first transistor T1, the eighth transistor T8 may include a gate electrode electrically connected to the scan line EBLi. The eighth transistor T8 may be turned on in response to the scan signal EBi received through the scan line EBLi to provide the bias voltage VBIAS to the first electrode of the first transistor T1.

The ninth transistor T9 may be electrically connected between the first driving voltage line VL1 and a first connection node CNij, and includes a gate electrode electrically connected to the emission line EMLi. The ninth transistor T9 may be turned on in response to the emission signal EMi received through the emission line EMLi to deliver the first driving voltage ELVDD to the first connection node CNij.

The tenth transistor T10 may be electrically connected between the second driving voltage line VL2 and the first connection node CNij, and includes a gate electrode electrically connected to the emission line EMLi. The tenth transistor T10 may be turned on in response to the emission signal EMi received through the emission line EMLi to deliver the compensation voltage VSUS to the first connection node CNij.

The capacitor CST may be electrically connected between the first connection node CNij and the second node N2. The capacitor CST may be formed between the gate electrode of the first transistor T1 and a connection line CLi, which will be described later. The capacitor CST may include an upper electrode UE and a lower electrode LE.

The anode of the light emitting element ED may be electrically connected to the sixth transistor T6, and a cathode thereof may be electrically connected to the third driving voltage line VL3 for supplying the second driving voltage ELVSS.

A circuit configuration of the first pixel PXij according to an embodiment of the disclosure may not be limited to an embodiment in FIG. 2. The number of transistors included in the first pixel PXji, the number of capacitors included in the pixel PXji, and the connection relationship thereof may be modified in various manners.

FIG. 2 shows the second pixel PXij+1 positioned in an i-th row in a same manner as the first pixel PXij. The second pixel PXij+1 may include a circuit configuration similar to that of the first pixel PXij. Same reference numerals may be used for a same circuit configuration in the second pixel PXij+1 as that in the first pixel PXij, and additional descriptions may be omitted to avoid redundancy.

The second transistor T2 of the second pixel PXij+1 may be electrically connected between the data line DLj+1 and the first node N1, and may include a gate electrode electrically connected to the scan line GWLi. The ninth transistor T9 of the second pixel PXij+1 may be electrically connected between the first driving voltage line VL1 and the second connection node CNij+1, and may include a gate electrode electrically connected to the emission line EMLi. The tenth transistor T10 of the second pixel PXij+1 may be electrically connected between the second driving voltage line VL2 and the second connection node CNij+1, and may include a gate electrode electrically connected to the emission line EMLi. The first connection node CNij of the first pixel PXij may be electrically connected to the second connection node CNij+1 of the second pixel PXij+1 through the connection line CLi.

Figure 3:
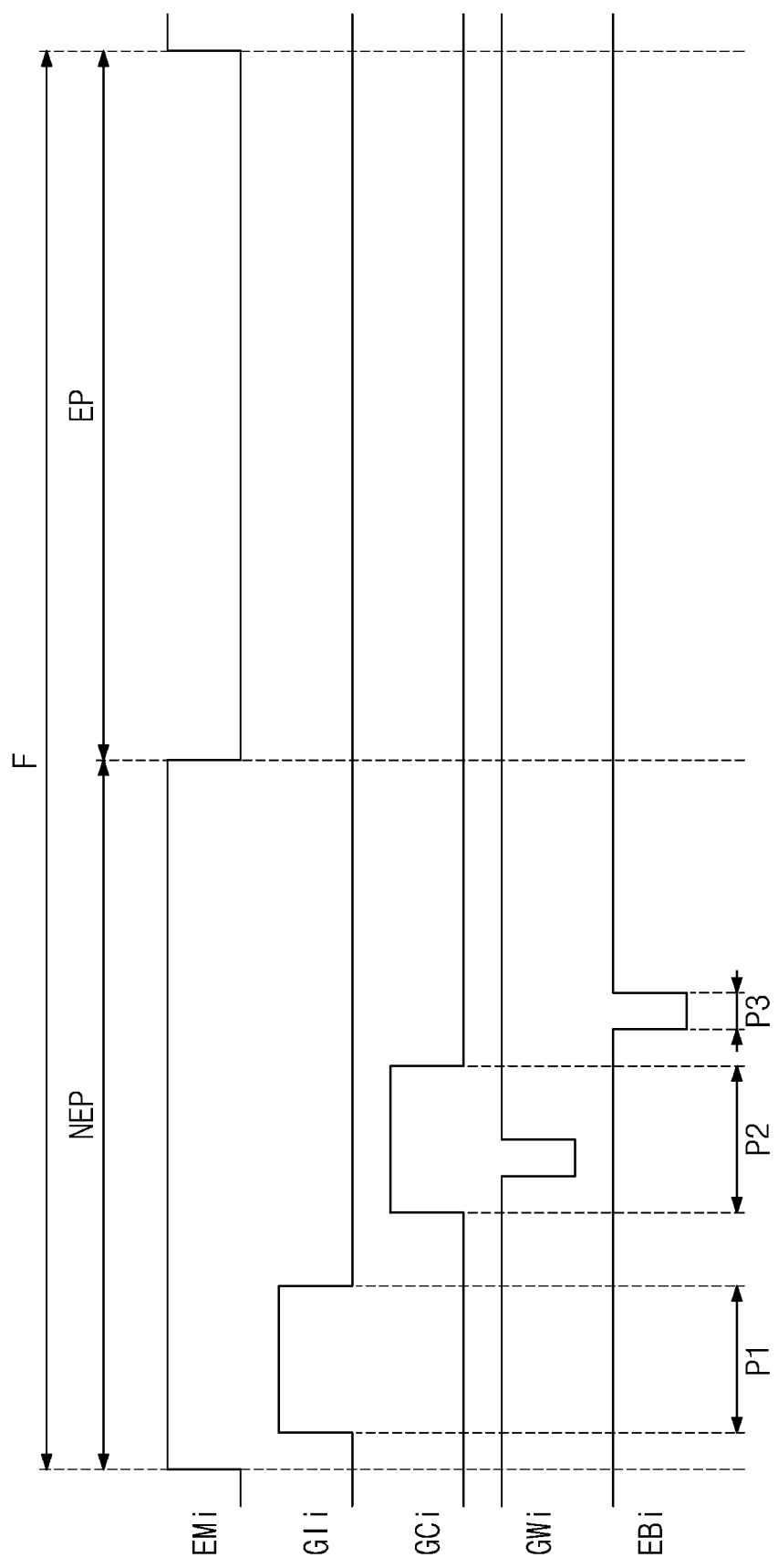
FIG. 3 is a timing diagram describing an operation of the pixels shown in FIG. 2.

FIG. 3 is a timing diagram for describing an operation of the pixels shown in FIG. 2. Referring to FIGS. 2 and 3, in an embodiment, one frame 'F' may include a non-emission period NEP and an emission period EP. The non-emission period NEP may be a period in which the light emitting element ED does not emit light. The emission period EP may be a period in which the light emitting element ED emits light. The non-emission period NEP may include an initialization period P1, a compensation and write period P2, and a bias period P3.

During the initialization period P1, the scan signal GIi of a high level may be provided through the scan line GILi. The fourth transistor T4 may be turned on in response to the scan signal Gli of a high level. In case that the fourth transistor T4 is turned on, the first initialization voltage VINT may be delivered to the gate electrode of the first transistor T1. Accordingly, during the initialization period P1, the gate electrode of the first transistor T1 may be initialized to the first initialization voltage VINT.

In case that the scan signal GCi of a high level is supplied through the scan line GCLi during the compensation and write period P2, the third transistor T3 may be turned on so that the first transistor T1 may be diode-connected and may be forward-biased. In the meantime, in case that the scan signal GWi transitions to a low level during the compensation and write period P2, the second transistor T2 may be turned on so that the data signal Dj provided to the data line DLj may be provided to the first electrode of the first transistor T1 through the second transistor T2. Because the third transistor T3 may be turned on, a voltage "Vdata-Vth" obtained by subtracting a threshold voltage (referred to as "Vth") of the first transistor T1 from a voltage (referred to as "Vdata") of the data signal Dj may be provided to the lower electrode LE of the capacitor CST through the first transistor T1.

In case that the scan signal EBi of a low level is provided through the scan line EBLi during the bias period P3, the eighth transistor T8 may be turned on so that the bias voltage VBIAS may be provided to the first electrode of the first transistor T1. The emission signal EMi may be at a high level during the non-emission period NEP, and thus the seventh transistor T7 may be turned on so that the anode of the light emitting element ED may be initialized to the second initialization voltage VAINT.

Because the emission signal EMi may be at a high level during the non-emission period NEP, the tenth transistor T10 may be turned on, and the ninth transistor T9 may be turned off. Accordingly, the compensation voltage VSUS may be provided to the first connection node CNij through the tenth transistor T10.

Subsequently, in case that the emission signal EMi transitions to a low level during the emission period EP, the fifth transistor T5 and the sixth transistor T6 may be turned on. In case that the fifth transistor T5 and the sixth transistor T6 are turned on, a current may be delivered from the first driving voltage line VL1 to the light emitting element ED through the fifth transistor T5, the first transistor T1, and the sixth transistor T6. At this time, a current corresponding to the charge stored in the capacitor CST flows through the first transistor T1, and thus the light emitting element ED may emit light. In case that the ninth transistor T9 is turned on in response to the emission signal EMi of a low level during the emission period EP, the first driving voltage ELVDD may be provided to the first connection node CNij through the ninth transistor T9.

In case that a current path is formed between the first driving voltage line VL1 and the third driving voltage line VL3 during the emission period EP, the voltage level of the first driving voltage ELVDD in the first driving voltage line VL1 may be changed due to a voltage drop phenomenon (or an IR drop). For example, a voltage level of the first driving voltage ELVDD may be different depending on a location of the first pixel PXij.

In case that the first pixel PXij does not include the ninth transistor T9 and the tenth transistor T10 and the first driving voltage line VL1 is connected (e.g., directly electrically connected) to the first connection node CNij while the voltage "Vdata-Vth" is provided to the lower electrode LE of the capacitor CST during the compensation and write period P2, the voltage level of the upper electrode UE of the capacitor CST may be different for each of the pixels PX (refer to FIG. 1). Even in case that a same data signal is provided to the pixels PX, the amount of charge charged in the capacitor CST of each of the pixels PX may be different. This causes a luminance deviation between the pixels PX, resulting in a degradation of the image quality.

In an embodiment of the disclosure, the compensation voltage VSUS may be provided to the upper electrode UE of the capacitor CST during the non-emission period NEP. The second driving voltage line VL2 provided with the compensation voltage VSUS may have a path of a current leakage smaller than the first driving voltage line VL1, and thus a voltage drop may be small.

Figure 4:
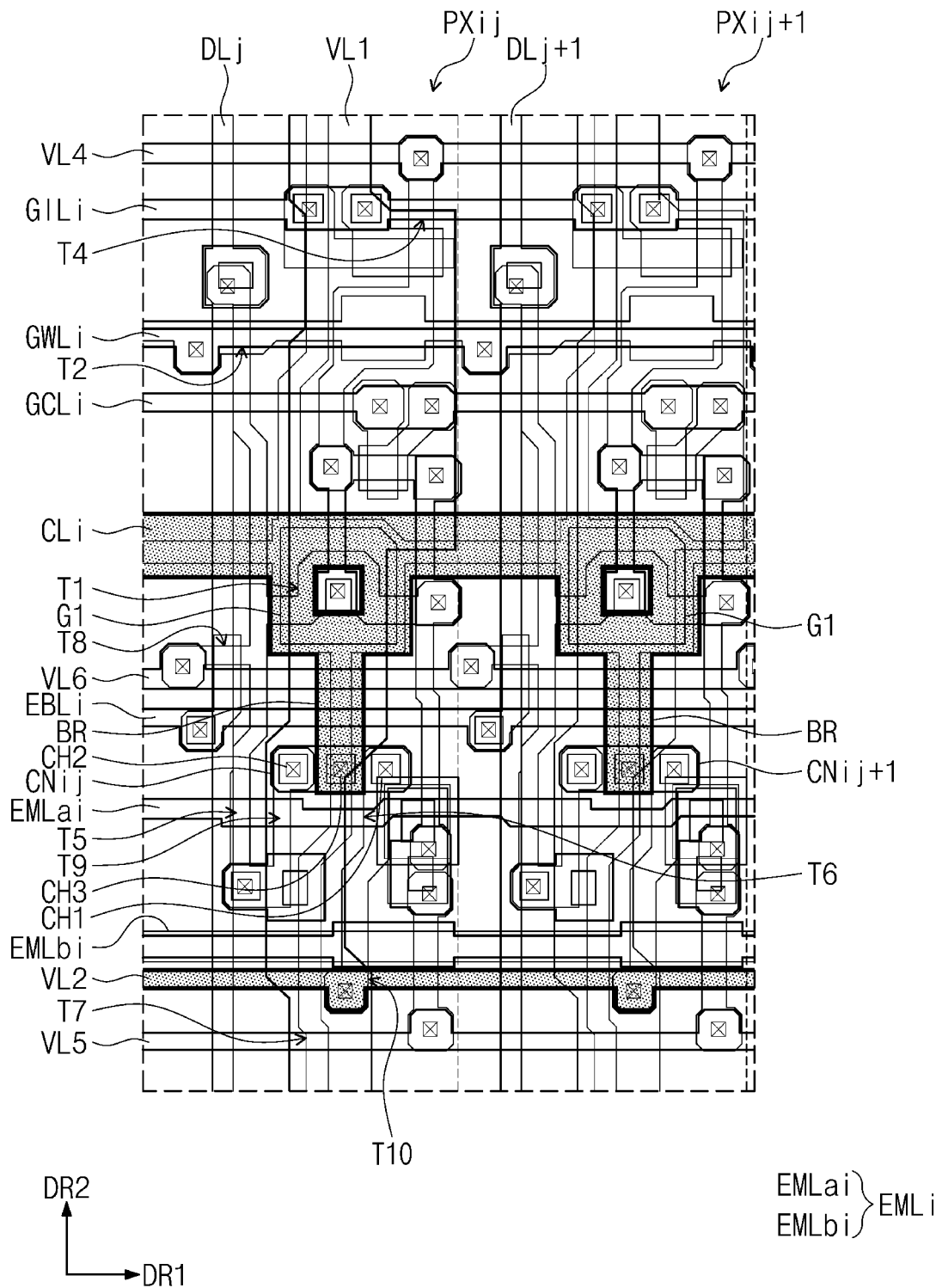
FIG. 4 is a plan view of a first pixel and a second pixel according to an embodiment of the disclosure.

FIG. 4 is a plan view of the first pixel PXij and the second pixel PXij+1, according to an embodiment of the disclosure. FIG. 4 shows some configurations of the first pixel PXij and the second pixel PXij+1. The plan view shown in FIG. 4 may be only an example, and the disclosure may not be limited thereto. The second pixel PXij+1 may be substantially a same as the first pixel PXij, and thus only the first pixel PXij is described.

Referring to FIGS. 2 and 4, the first pixel PXij may include the first to tenth transistors T1 to T10. The first pixel PXij may be electrically connected to the scan lines GILi, GCLi, GWLi, and EBLi and the emission line EMLi. The emission line EMLi may include a first emission line EMLai and a second emission line EMLbi. In an embodiment, the fifth transistor T5 and the sixth transistor T6 may be P-type transistors, respectively, and thus a gate electrode of each of the fifth transistor T5 and the sixth transistor T6 may be electrically connected to the first emission line EMLai. In an embodiment, the seventh transistor T7 and the tenth transistor T10 may be N-type transistors, respectively, and thus a gate electrode of each of the seventh transistor T7 and the tenth transistor T10 may be electrically connected to the second emission line EMLbi. The first emission line EMLai and the second emission line EMLbi may be formed as different conductive layers. In an embodiment, the emission signal EMi may be commonly provided to the first emission line EMLai and the second emission line EMLbi.

The ninth transistor T9 may be electrically connected to the first connection node CNij through a first contact hole CH1. The tenth transistor T10 may be electrically connected to the first connection node CNij through a second contact hole CH2. The connection line CLi may be electrically connected to the first connection node CNij through a third contact hole CH3. The first connection node CNij of the first pixel PXij may be electrically connected to the second connection node CNij+1 of the second pixel PXij+1 through the connection line CLi.

Figure 5:
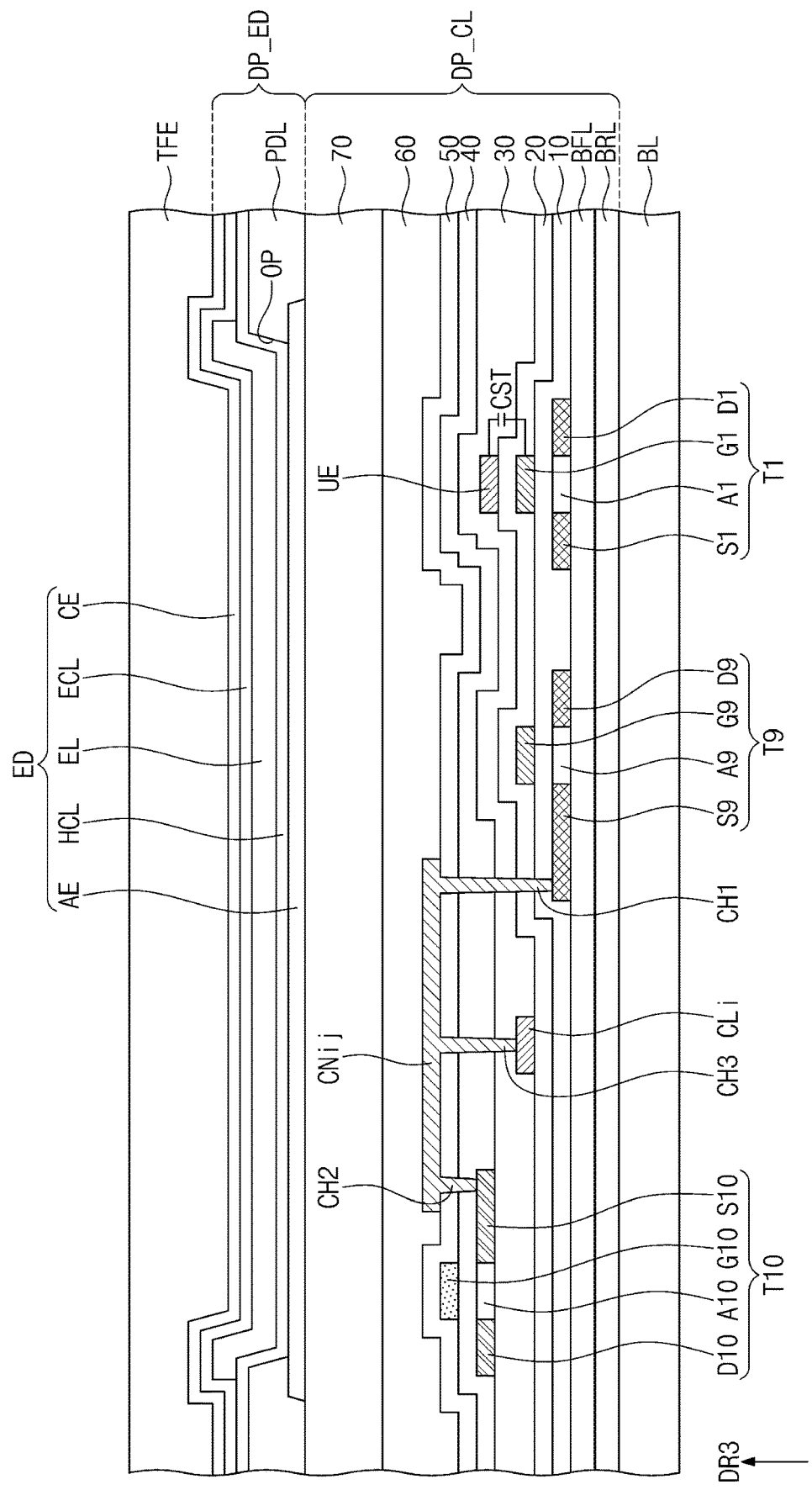
FIG. 5 is a schematic cross-sectional view of the first pixel shown in FIG. 4.

FIG. 5 is a schematic cross-sectional view of the first pixel PXij. FIG. 5 shows only the first transistor T1, the ninth transistor T9, the tenth transistor T10, the capacitor CST, and the light emitting element ED among the components of the first pixel Pxij. Also, a schematic cross-section of the second pixel PXij+1 illustrated in FIG. 2 may be similar to the first pixel PXij illustrated in FIG. 5. Referring to FIG. 5, the display panel DP may include a base layer BL, a circuit layer DP_CL disposed on the base layer BL, an element layer DP_ED, and an encapsulation layer TFE.

The base layer BL may include a synthetic resin layer. The synthetic resin layer may include a thermosetting resin. In detail, the synthetic resin layer may be a polyimide-based resin layer, and the material thereof may not be limited thereto. The synthetic resin layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. Besides, the base layer BL may include a glass substrate, a metal substrate, an organic/inorganic composite substrate, the like, or a combination thereof.

At least one inorganic layer may be formed on an upper surface of the base layer BL. The inorganic layer may include at least one of aluminum oxide, titanium oxide, silicon oxide, silicon oxynitride, zirconium oxide, and hafnium oxide. The inorganic layer may be formed of multiple layers. The multiple inorganic layers may constitute a barrier layer BRL and/or a buffer layer BFL, which will be described later. The barrier layer BRL and the buffer layer BFL may be disposed selectively.

The barrier layer BRL may prevent foreign objects from entering from the outside. The barrier layer BRL may include a silicon oxide layer and a silicon nitride layer. Each of the silicon oxide layer and the silicon nitride layer may include multiple layers, and the multiple silicon oxide layers and the silicon nitride layers may be alternately stacked on each other.

The buffer layer BFL may be disposed on the barrier layer BRL. The buffer layer BFL may improve a bonding force between the base layer BL and a semiconductor pattern and/or a conductive pattern. The buffer layer BFL may include a silicon oxide layer and a silicon nitride layer. The silicon oxide layer and the silicon nitride layer may be alternately stacked on each other.

The semiconductor pattern may be disposed on the buffer layer BFL. Hereinafter, a semiconductor pattern disposed (e.g., directly disposed) on the buffer layer BFL may be defined as a first semiconductor pattern. The first semiconductor pattern may include a silicon semiconductor. The first semiconductor pattern may include polysilicon, however an embodiment may not be limited thereto. For example, the first semiconductor pattern may instead include amorphous silicon.

FIG. 5 only illustrates a part of the first semiconductor pattern. The first semiconductor pattern may be further positioned in another area of the pixel PXij (refer to FIG. 4). An electrical property of the first semiconductor pattern may vary depending on whether it may be doped or not. The first semiconductor pattern may include a doped area and an undoped area. The doped area may be doped with an N-type dopant or a P-type dopant. A P-type transistor may include a doped area doped with the P-type dopant, and an N-type transistor includes a doped area doped with the N-type dopant.

The doped area may have higher conductivity than the undoped area, and may substantially operate as an electrode or a signal line. The undoped area may substantially correspond to the active area (or channel) of a transistor. In other words, a part of the first semiconductor pattern may be an active area of a transistor. Another part thereof may be a source or drain of the transistor. Another part thereof may be a connection signal line (or a connection electrode).

As illustrated in FIG. 5, a first electrode S1, a channel part A1, and a second electrode D1 of the first transistor T1 may be formed from the first semiconductor pattern. The first electrode S1 and the second electrode D1 of the first transistor T1 may extend in opposite directions from the channel part A1.

A first electrode S9, a channel part A9, and a second electrode D9 of the ninth transistor T9 may also be formed from the first semiconductor pattern. The first electrode S9 and the second electrode D9 of the ninth transistor T9 may extend in opposite directions from the channel part A9.

A first insulating layer 10 may be disposed on the buffer layer BFL. The first insulating layer 10 may overlap the first and second pixels PXij and PXij+1 (refer to FIG. 4) in common and covers the first semiconductor pattern. The first insulating layer 10 may be an inorganic layer and/or an organic layer, and may have a single layer or multi-layer structure. The first insulating layer 10 may include at least one of an aluminum oxide, a titanium oxide, a silicon oxide, a silicon oxynitride, a zirconium oxide, and a hafnium oxide. In an embodiment, the first insulating layer 10 may be a silicon oxide layer having a single layer structure. An insulating layer of the circuit layer DP_CL, which is to be described later, as well as the first insulating layer 10 may be an inorganic layer and/or an organic layer, and may have a single layer structure or a multi-layer structure. The inorganic layer may include at least one of the materials described above.

A gate electrode G1 of the first transistor T1 and a gate electrode G9 of the ninth transistor T9 may be positioned on the first insulating layer 10. Each of the gate electrodes G1 and G9 may be a part of a metal pattern. The gate electrode G1 of the first transistor T1 may overlap the channel part A1 of the first transistor T1. In a process of doping the first semiconductor pattern, the gate electrode G1 of the first transistor T1 may serve as a mask. The gate electrode G9 of the ninth transistor T9 may overlap the channel part A9 of the ninth transistor T9. In a process of doping the first semiconductor pattern, the gate electrode G9 of the ninth transistor T9 may serve as a mask.

A second insulating layer 20 covering the gate electrodes G1 and G9 may be disposed on the first insulating layer 10. The second insulating layer 20 may overlap the first and second pixels PXij and PXij+1 (refer to FIG. 4) in common. The second insulating layer 20 may be an inorganic layer and/or an organic layer, and may have a single layer structure or a multi-layer structure. In an embodiment, the second insulating layer 20 may instead be a silicon oxide layer having a single layer structure.

An upper electrode UE and the connection line CLi may be disposed on the second insulating layer 20. The upper electrode UE may overlap the gate electrode G1. The upper electrode UE may be a portion of a metal pattern or a portion of a doped semiconductor pattern. The capacitor CST (refer to FIG. 2) may be defined by a part of the first electrode G1 of the first transistor T1 and the upper electrode UE overlapping the part of the first electrode G1 of the first transistor T1. In an embodiment of the disclosure, the gate electrode G1 of the first transistor T1 may function as the lower electrode LE of the capacitor CST.

In an embodiment, the upper electrode UE and the connection line CLi may be formed of a same material by a same process. In an embodiment of the disclosure, the second insulating layer 20 may be replaced with an insulating pattern. The upper electrode UE may be positioned on the insulating pattern. The upper electrode UE may serve as a mask for forming an insulating pattern from the second insulating layer 20.

A third insulating layer 30 covering the upper electrode UE may be disposed on the second insulating layer 20. In an embodiment, the third insulating layer 30 may be a silicon oxide layer having a single layer structure. The third insulating layer 30 may cover both the first transistor T1 and the ninth transistor T9.

A semiconductor pattern may be disposed on the third insulating layer 30. Hereinafter, the semiconductor pattern disposed (e.g., directly disposed) on the third insulating layer 30 may be defined as a second semiconductor pattern. The second semiconductor pattern may include metal oxide. The oxide semiconductor may include a crystalline or amorphous oxide semiconductor. For example, the oxide semiconductor may include oxides of metals (e.g., zinc (Zn), indium (In), gallium (Ga), tin (Sn), titanium (Ti), and the like) or a mixture of the metals (e.g., zinc (Zn), indium (In), gallium (Ga), tin (Sn), titanium (Ti), the like, or a combination thereof) and oxides of the metals. The oxide semiconductors may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), the like, or a combination thereof.

FIG. 5 only illustrates a part of the second semiconductor pattern. The second semiconductor pattern may be further disposed in another area of the first pixel PXij (refer to FIG. 4). The second semiconductor pattern may include multiple areas identified depending on whether the metal oxide may be reduced. An area (hereinafter referred to as a "reduction area") in which the metal oxide may be reduced has higher conductivity than an area (hereinafter referred to as a "non-reduction area") in which the metal oxide may not be reduced. The reduction area may substantially have a role of an electrode or signal line. The non-reduction area substantially may correspond to a channel part of a transistor. In other words, the portion of the second semiconductor pattern may be a channel part of a transistor, and another portion thereof may be a first electrode or a second electrode of the transistor.

As illustrated in FIG. 5, a second electrode D10, a channel part A10, and a first electrode S10 of the tenth transistor T10 may be formed from the second semiconductor pattern. The second electrode D10 and the first electrode S10 may include a metal reduced from a metal oxide semiconductor. The second electrode D10 and the first electrode S10 may have a given thickness from an upper surface of the second semiconductor pattern and may include a metal layer including the reduced metal.

A fourth insulating layer 40 covering the second semiconductor pattern may be disposed on the third insulating layer 30. In an embodiment, the fourth insulating layer 40 may be a silicon oxide layer having a single layer structure. A gate electrode G10 of the tenth transistor T10 may be disposed on the fourth insulating layer 40. The gate electrode G10 may be a part of a metal pattern. The gate electrode G10 of the tenth transistor T10 may overlap the channel part A10 of the tenth transistor T10.

In an embodiment of the disclosure, the fourth insulating layer 40 may be replaced with an insulating pattern. The gate electrode G10 of the tenth transistor T10 may be disposed on the insulating pattern. In an embodiment, the gate electrode G10 may have a same shape as the insulating pattern on a plane.

A fifth insulating layer 50 covering the gate electrode G10 may be disposed on the fourth insulating layer 40. In an embodiment, the fifth insulating layer 50 may include a silicon oxide layer and a silicon nitride layer. The fifth insulating layer 50 may include multiple silicon oxide layers and multiple silicon nitride layers, which may be alternately stacked on each other.

At least one insulating layer may be further disposed on the fifth insulating layer 50. In an embodiment, a sixth insulating layer 60 and a seventh insulating layer 70 may be disposed on the fifth insulating layer 50. The sixth insulating layer 60 and the seventh insulating layer 70 may be organic layers, and may have a single layer or multi-layer structure. The sixth insulating layer 60 and the seventh insulating layer 70 may be a polyimide-based resin layer having a single layer structure. An embodiment may not be limited thereto. For example, the sixth insulating layer 60 and the seventh insulating layer 70 may instead include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin.

The first connection node CNij may be disposed on the fifth insulating layer 50. The first connection node CNij may be electrically connected to the first electrode S9 of the ninth transistor T9 through a first contact hole CH1 passing through the first to fifth insulating layers 10 to 50. The first connection node CNij may also be electrically connected to the first electrode S10 of the tenth transistor T10 through a second contact hole CH2 passing through the fourth insulating layer 40 and the fifth insulating layer 50. The first connection node CNij may also be electrically connected to the connection line CLi through a third contact hole CH3 passing through the third insulating layer 30, the fourth insulating layer 40, and the fifth insulating layer 50.

The element layer DP_ED may include the light emitting element ED and a pixel defining layer PDL. An anode AE of the light emitting element ED may be disposed on the seventh insulating layer 70. An opening OP of the pixel defining layer PDL may expose at least part of the anode AE of the light emitting element ED. A hole control layer HCL may be disposed on the anode AE. The hole control layer HCL may include a hole transport layer and a hole injection layer.

The light emitting layer EL may be disposed on the hole control layer HCL. The light emitting layer EL may be disposed in only an area corresponding to the opening OP. The light emitting layer EL may be separately formed on each of the pixels PX (refer to FIG. 1). In an embodiment, the patterned light emitting layer EL may be illustrated. However, the light emitting layer EL may be disposed in the pixels PX in common. At this time, the light emitting layer EL may generate white light or blue light. Also, the light emitting layer EL may have a multi-layer structure.

An electron control layer ECL may be disposed on the light emitting layer EL. The electron control layer ECL may include an electron transport layer and an electron injection layer. A cathode CE of the light emitting element ED may be disposed on the electron control layer ECL. The electron control layer ECL and the cathode CE may be disposed in common in the pixels PX.

The encapsulation layer TFE may be disposed on the cathode CE. The encapsulation layer TFE may cover the pixels PX. In an embodiment, the encapsulation layer TFE may cover (e.g., directly covers) the cathode CE. In an embodiment of the disclosure, the display panel DP may further include a capping layer covering (e.g., directly covering) the cathode CE. In an embodiment of the disclosure, the stacked structure of the light emitting element ED may have a vertically inverted structure in the structure shown in FIG. 5.

Referring to FIGS. 4 and 5, the connection line CLi may extend in the first direction DR1 and may overlap the gate electrodes G1 of the first and second pixels PXij and PXij+1. A branch part BR may extend from the connection line CLi in the second direction DR2. The branch parts BR of the connection line CLi may be electrically connected to the first connection node Cnij and the second connection node Cnij+1, respectively.

A portion of the connection line CLi overlapping the gate electrode G1 of the first pixel Pxij may function as the upper electrode UE of the capacitor CST of the first pixel Pxij. A portion of the connection line CLi overlapping the gate electrode G1 of the second pixel Pxij+1 may function as the upper electrode UE of the capacitor CST of the second pixel Pxij+1.

In an embodiment, the connection line CLi may be disposed to overlap the first driving voltage line VL1. In an embodiment, the connection line CLi may be spaced apart from the second driving voltage line VL2 in the second direction DR2.

As described above, during the compensation and write period P2, a voltage "Vdata-Vth" may be supplied to the lower electrode LE of the capacitor CST. In case that the voltage level of the upper electrode UE (i.e., the first connection node CNij) of the capacitor CST may be different for each of the pixels PX due to a voltage drop phenomenon, the amount of charge charged to the capacitor CST of each of the pixels PX may be different, even in case that a same data signal may be provided to the pixels PX. This causes a luminance deviation between the pixels PX that degrades the image quality.

As shown in FIG. 4, the sheet resistance of the connection line CLi (i.e., the upper electrode UE of the capacitor CST) may be reduced by maximizing the area of the connection line CLi by having a mesh structure. Accordingly, the voltage drop of the first driving voltage ELVDD and the compensation voltage VSUS provided to the upper electrode UE of the capacitor CST may be minimized.

Figure 6:
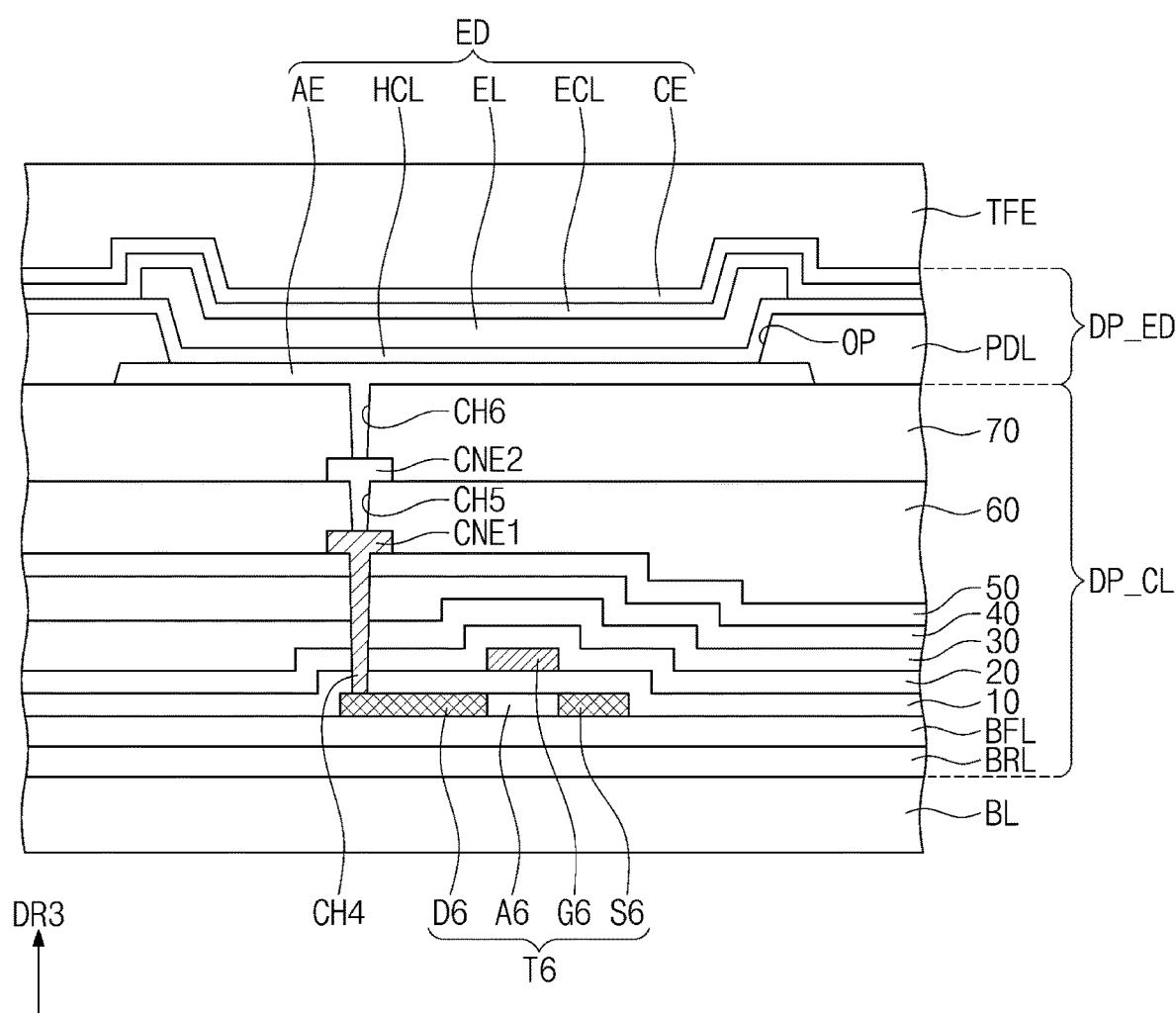
FIG. 6 is a schematic cross-sectional view of a sixth transistor of the first pixel of FIG. 4.

FIG. 6 is a schematic cross-sectional view of the sixth transistor TR6 of the first pixel PXij. The sixth transistor TR6 of the first pixel PXij shown in FIG. 6 has a configuration similar to that of the first transistor TR1 of the first pixel PXij shown in FIG. 5, and thus additional descriptions will be omitted to avoid redundancy. A first electrode S6, a channel part A6, and a second electrode D6 of the sixth transistor T6 may be formed from the first semiconductor pattern. The first electrode S6 and the second electrode D6 of the sixth transistor T6 may extend in opposite directions from the channel part A6. The gate electrode G6 of the sixth transistor T6 may overlap the channel part A6 of the sixth transistor T6. Moreover, the light emitting element ED of the first pixel PXij shown in FIG. 6 may be a same as the light emitting element ED shown in FIG. 5, and thus additional descriptions will be omitted to avoid redundancy.

Referring to FIG. 6, the anode AE of the light emitting element ED may be electrically connected to a second connection electrode CNE2 through a sixth contact hole CH6 passing through the seventh insulating layer 70. The second connection electrode CNE2 may be electrically connected to the first connection electrode CNE1 through a fifth contact hole CH5 passing through the sixth insulating layer 60. The first connection electrode CNE1 may be electrically connected to the second electrode D6 of the sixth transistor T6 through a fourth contact hole CH4 passing through the first to fifth insulating layers 10, 20, 30, 40, and 50. Accordingly, the anode AE of the light emitting element ED may be electrically connected to the second electrode D6 of the sixth transistor T6 through the second connection electrode CNE2 and the first connection electrode CNE1.

Figure 7:
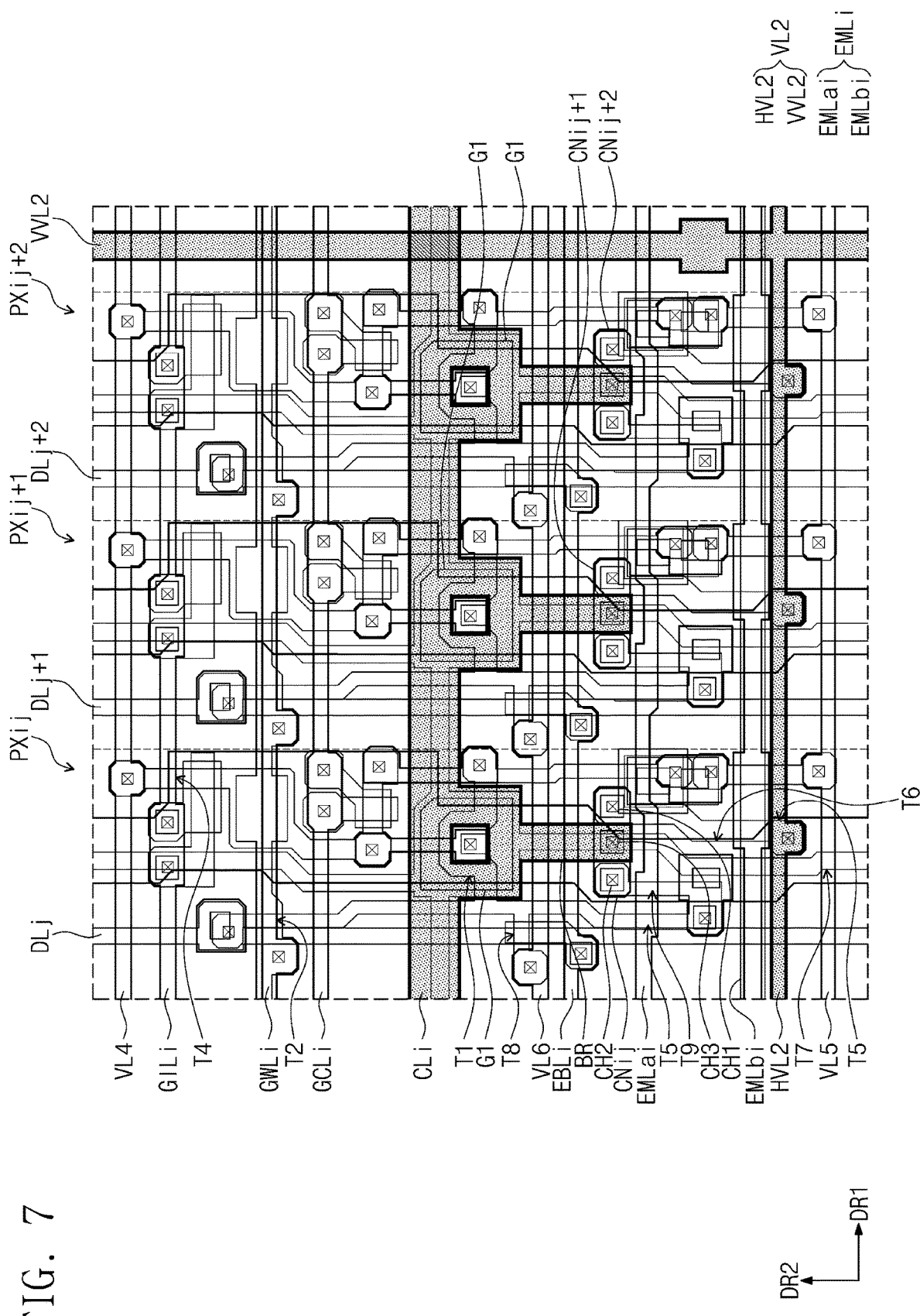
FIG. 7 is a plan view of first to third pixels according to an embodiment of the disclosure.

FIG. 7 is a plan view of first to third pixels, according to an embodiment of the disclosure. FIG. 7 shows some configurations of the first pixel PXij, the second pixel PXij+1, and a third pixel PXij+2. The plan view shown in FIG. 7 may be only an example, and the disclosure may not be limited thereto. Each of the first pixel PXij, the second pixel PXij+1, and the third pixel PXij+2 illustrated in FIG. 7 may be substantially a same as the first pixel PXij illustrated in FIG. 4, and thus additional descriptions will be omitted to avoid redundancy.

The second driving voltage line VL2 includes a horizontal driving voltage line HVL2 and a vertical driving voltage line VVL2. The horizontal driving voltage line HVL2 may extend in the first direction DR1. The vertical driving voltage line VVL2 may extend in the second direction DR2. The horizontal driving voltage line HVL2 and the vertical driving voltage line VVL2 may be electrically connected to each other at an intersecting portion. In an embodiment, the horizontal driving voltage line HVL2 and the vertical driving voltage line VVL2 may not be electrically connected to each other at the intersecting portion, but may instead be electrically connected to each other in the non-display area NDA (refer to FIG. 1).

In an embodiment, the first pixel PXij, the second pixel PXij+1, and the third pixel PXij+2 may be sequentially arranged in the first direction DR1. The vertical driving voltage line VVL2 may be arranged adjacent to the third pixel PXij+2. The vertical driving voltage line VVL2 may be arranged every three pixels in the first direction DR1.

The compensation voltage VSUS may be provided to the connection lines CLi during the non-emission period NEP (refer to FIG. 3). Accordingly, during the non-emission period NEP, the compensation voltage VSUS may be delivered to all of the connection lines CLi, the horizontal driving voltage line HVL2, and the vertical driving voltage line VVL2.

During the non-emission period NEP, the connection line CLi, the horizontal driving voltage line HVL2, and the vertical driving voltage line VVL2, through each of which the compensation voltage VSUS may be delivered, have a mesh shape. A voltage level fluctuation of the compensation voltage VSUS due to a voltage drop phenomenon may be minimized by maximizing an area of a line through which the compensation voltage VSUS may be delivered.

In case that a voltage corresponding to a data signal may be provided to a lower electrode of a capacitor in a pixel, a display device having such a configuration provides a compensation voltage to an upper electrode of the capacitor, and thus charges corresponding to the data signal may be accumulated in the capacitor. In particular, the sheet resistance of the upper electrode may be reduced by maximizing an area of the upper electrode of the capacitor. As a result, the voltage drop of a first driving voltage and a compensation voltage provided to the upper electrode of the capacitor may be minimized, thereby preventing deterioration of the image quality of a display device.

Although an embodiment of the disclosure has been described for illustrative purposes, those skilled in the art will appreciate that various modifications, and substitutions may be possible, without departing from the scope and spirit of the disclosure as disclosed in the accompanying claims.

Accordingly, the technical scope of the disclosure may not be limited to the detailed description of this specification, but should be defined by the claims.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display device comprising:
a display panel including:
   a first pixel;
   a second pixel; and
   a connection line electrically connecting the first pixel and the second pixel, wherein
each of the first pixel and the second pixel includes:
   a light emitting element;
   a first transistor including a first electrode, a second electrode electrically connected to the light emitting element, and a gate electrode;
   a second transistor electrically connected between a first driving voltage line and a connection node and including a gate electrode electrically connected to an emission line;
   a third transistor electrically connected between a second driving voltage line and the connection node and including a gate electrode electrically connected to the emission line;
   a fifth transistor electrically connected between the second transistor and the first electrode of the first transistor and including a gate electrode electrically connected to the emission line; and
   a capacitor electrically connected between the gate electrode of the first transistor and the connection node, and
the connection node of the first pixel is electrically connected to the connection node of the second pixel through the connection line.

2. The display device of claim 1, wherein
a compensation voltage from the second driving voltage line is provided to the connection node of each of the first pixel and the second pixel by the third transistor upon an emission signal provided to the emission line being at a first level, and
a first driving voltage from the first driving voltage line is provided to the connection node of each of the first pixel and the second pixel by the second transistor upon the emission signal provided to the emission line being at a second and different level.

3. The display device of claim 1, wherein
each of the first transistor and the second transistor is a P-type transistor, and
the third transistor is an N-type transistor.

4. The display device of claim 1, wherein each of the first pixel and the second pixel further comprises:
   a fourth transistor electrically connected between the gate electrode of the first transistor and a third driving voltage line;
   a sixth transistor electrically connected between the second electrode of the first transistor and an anode of the light emitting element and including a gate electrode electrically connected to the emission line;
   a seventh transistor electrically connected between the anode of the light emitting element and a fourth driving voltage line and including a gate electrode electrically connected to the emission line;
   an eighth transistor electrically connected between the second electrode of the first transistor and the gate electrode of the first transistor;
   a ninth transistor electrically connected between a data line and the first electrode of the first transistor; and
   a tenth transistor electrically connected between the first electrode of the first transistor and a fifth driving voltage line.

5. The display device of claim 4, wherein
each of the fifth transistor, the sixth transistor, the ninth transistor, and the tenth transistor is a P-type transistor, and
each of the fourth transistor, the seventh transistor, and the eighth transistor is an N-type transistor.

6. The display device of claim 1, wherein
during a non-emission period, the light emitting element does not emit light, and a compensation voltage from the second driving voltage line is provided to the connection node of each of the first pixel and the second pixel by the third transistor, and
during an emission period, the light emitting element emits light, and a first driving voltage from the first driving voltage line is provided to the connection node of each of the first pixel and the second pixel by the second transistor.

7. The display device of claim 1, wherein
the display panel further includes a third pixel, and
the connection line electrically connects the first pixel, the second pixel, and the third pixel.

8. The display device of claim 7, wherein the second driving voltage line further comprises:
   a horizontal driving voltage line extending in a first direction; and
   a vertical driving voltage line electrically connected to the horizontal driving voltage line and extending in a second direction intersecting the first direction, wherein the vertical driving voltage line is disposed adjacent to the third pixel.

9. A display device comprising:
a display panel including:
   a first pixel;
   a second pixel; and
   a connection line electrically connecting the first pixel and the second pixel,
wherein
each of the first pixel and the second pixel includes:
   a light emitting element;
   a first transistor including a first electrode, a second electrode, and a gate electrode;
   a second transistor including a first electrode electrically connected to the connection line, a second electrode electrically connected to a first driving voltage line, and a gate electrode electrically connected to an emission line;
   a third transistor including a first electrode electrically connected to the connection line, a second electrode electrically connected to a second driving voltage line, and a gate electrode electrically connected to the emission line; and
   a capacitor electrically connected between the gate electrode of the first transistor and the connection line,
the connection line is disposed to overlap in a plan view the gate electrode of the first transistor of the first pixel and the gate electrode of the first transistor of the second pixel such that overlapping parts of the connection line and gate electrode of the first transistor of each of the first and second pixels form the capacitor of each of the first and second pixels, respectively.

10. The display device of claim 9, wherein each of the first pixel and the second pixel further comprises a connection node, wherein the connection node of each of the first pixel and the second pixel is electrically connected to:
the first electrode of the second transistor through a first contact hole,
the first electrode of the third transistor through a second contact hole, and
the connection line through a third contact hole.

11. The display device of claim 10, wherein
the connection line extends in a first direction,
a branch part extends from the connection line in a second direction intersecting the first direction, and
the branch part is electrically connected to the connection node through the third contact hole.

12. The display device of claim 10, wherein
the display panel further comprises:
a base layer;
a first insulating layer disposed on the base layer; and
a second insulating layer disposed on the first insulating layer,
the first transistor, the second transistor, and the connection line are disposed between the base layer and the first insulating layer,
the third transistor is disposed between the first insulating layer and the second insulating layer, and
the connection node is disposed on the second insulating layer.

13. The display device of claim 12, wherein the connection line is connected to:
the first electrode of the second transistor through the first contact hole passing through both the first insulating layer and the second insulating layer,
the second electrode of the third transistor through the second contact hole passing through the second insulating layer, and
the connection node through the third contact hole passing through both the first insulating layer and the second insulating layer.

14. The display device of claim 10, wherein
a compensation voltage from the second driving voltage line is provided to the connection node of each of the first pixel and the second pixel by the third transistor upon an emission signal provided to the emission line being at a first level, and
a first driving voltage from the first driving voltage line is provided to the connection node of each of the first pixel and the second pixel by the second transistor upon the emission signal provided to the emission line being at a second and different level.

15. The display device of claim 9, wherein the connection line is spaced apart from the second driving voltage line in a second direction.

16. The display device of claim 9, wherein the connection line is disposed to overlap in a plan view the first driving voltage line.

17. The display device of claim 9, wherein
each of the first transistor and the second transistor is a P-type transistor, and
the third transistor is an N-type transistor.

18. The display device of claim 9, wherein each of the first pixel and the second pixel further comprises:
a fourth transistor electrically connected between the gate electrode of the first transistor and a third driving voltage line;
a fifth transistor electrically connected between the second transistor and the first electrode of the first transistor and including a gate electrode electrically connected to the emission line;
a sixth transistor electrically connected between the second electrode of the first transistor and an anode of the light emitting element and including a gate electrode electrically connected to the emission line;
a seventh transistor electrically connected between the anode of the light emitting element and a fourth driving voltage line and including a gate electrode electrically connected to the emission line;
an eighth transistor electrically connected between the second electrode of the first transistor and the gate electrode of the first transistor;
a ninth transistor electrically connected between a data line and the first electrode of the first transistor; and
a tenth transistor electrically connected between the first electrode of the first transistor and a fifth driving voltage line.

19. The display device of claim 18, wherein
each of the fifth transistor, the sixth transistor, the ninth transistor, and the tenth transistor is a P-type transistor, and
each of the fourth transistor, the seventh transistor, and the eighth transistor is an N-type transistor.

20. The display device of claim 9, wherein
the display panel further comprises a third pixel,
the connection line electrically connects to each of the first pixel, the second pixel, and the third pixel,
the second driving voltage line further includes:
a horizontal driving voltage line extending in a first direction; and
a vertical driving voltage line electrically connected to the horizontal driving voltage line and extending in a second direction intersecting the first direction, and
the vertical driving voltage line is disposed adjacent to the third pixel.

* * * * *